United States Patent
Hung et al.

(10) Patent No.: US 6,838,343 B2
(45) Date of Patent: Jan. 4, 2005

(54) FLASH MEMORY WITH SELF-ALIGNED SPLIT GATE AND METHODS FOR FABRICATING AND FOR OPERATING THE SAME

(75) Inventors: Chih-Wei Hung, Hsinchu (TW); Cheng-Yuan Hsu, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/709,310

(22) Filed: Apr. 28, 2004

(65) Prior Publication Data

US 2004/0196720 A1 Oct. 7, 2004

Related U.S. Application Data

(62) Division of application No. 10/249,024, filed on Mar. 11, 2003, now Pat. No. 6,765,260.

(51) Int. Cl.[7] .................. H01L 21/336; G11C 16/04
(52) U.S. Cl. .................. 438/257; 438/264; 438/267; 365/185.28
(58) Field of Search .................. 438/257, 264, 438/266, 267, 593; 365/185.28

(56) References Cited

U.S. PATENT DOCUMENTS

| | | | | | |
|---|---|---|---|---|---|
| 5,040,036 A | * | 8/1991 | Hazani | .................. | 365/185.28 |
| 5,115,288 A | * | 5/1992 | Manley | .................. | 257/316 |
| 5,408,115 A | * | 4/1995 | Chang | .................. | 257/324 |
| 5,422,504 A | * | 6/1995 | Chang et al. | .......... | 365/185.15 |
| 5,751,631 A | * | 5/1998 | Liu et al. | ................ | 365/185.01 |
| 5,943,261 A | * | 8/1999 | Lee | .................. | 365/185.14 |
| 6,074,914 A | * | 6/2000 | Ogura | .................. | 438/257 |
| 6,074,915 A | * | 6/2000 | Chen et al. | .................. | 438/258 |
| 6,103,602 A | * | 8/2000 | Thurgate et al. | ............ | 438/525 |
| 6,204,126 B1 | * | 3/2001 | Hsieh et al. | ................. | 438/267 |
| 6,245,614 B1 | * | 6/2001 | Hsieh | .................. | 438/267 |
| 6,479,859 B2 | * | 11/2002 | Hsieh et al. | ................. | 257/315 |
| 2003/0034517 A1 | * | 2/2003 | Chen | .................. | 257/315 |

* cited by examiner

Primary Examiner—Matthew Smith
Assistant Examiner—Lex H. Malsawma
(74) Attorney, Agent, or Firm—Jiang Chyun IP Office (57) ABSTRACT

A flash memory with a self-aligned spilt gate and the methods for fabricating and operating the same are described. The flash cell consists of a substrate having a deep n-type well and a shallow p-type well in the deep n-type well therein, a control gate structure on the gate oxide layer located on the p-type shallow well, a floating gate on one sidewall of the control gate and over the substrate, a tunnel oxide layer between the control gate and the floating gate and between the floating gate and the substrate, a drain and a common source disposed beneath each side of the control gate in the substrate, wherein the depth of the drain and the common source are larger than the depth of the shallow p-type well, a pocket p-type well in the substrate around the drain and electrically connecting with the shallow p-type well.

17 Claims, 8 Drawing Sheets

FLASH MEMORY WITH SELF-ALIGNED SPLIT GATE AND METHODS FOR FABRICATING AND FOR OPERATING THE SAME

CROSS REFERENCE TO RELATED APPLICATIONS

This application is a divisional of a prior application Ser. No. 10/249,024, filed Mar. 11, 2003 now U.S. Pat. No. 6,765,260.

BACKGROUND OF INVENTION

1. Field of the Invention

The present invention relates to a non-volatile memory (NVM) and the methods for fabricating and for operating the same. More particularly, the present invention relates to a flash memory with a self-aligned spilt gate and methods for fabricating and operating the same.

2. Background of the Invention

Flash memory can retain information even when power is interrupted and is small in size, faster in reading/programming and can resist vibration, so it is widely used. A flash memory comprises a floating gate and a control gate that are isolated by a dielectric layer, wherein the floating gate is isolated from the substrate by a tunnel oxide layer. During the writing/erase operation, electrons are injected into/ejected from the floating gate with a voltage applied to the control gate. During the reading operation, a working voltage is applied to the control gate. At this time, the charging state on the floating gate causes a conducting status of ON or OFF of the channel that is under the floating gate. The conducting state of ON/Off corresponds to the data of 0/1. The data in the above mentioned flash memory is erased by increasing the potential of the substrate, the drain/source or the control gate relative to the floating gate. The electrons ejected from the floating gate flow into the substrate or the drain/source via the tunnel oxide layer by tunneling. This mechanism is known as substrate erase mechanism or drain/source side erase mechanism. Another mechanism is to eject the electrons in the floating gate to the control gate via the dielectric layer. However, the amount of the electrons ejected from the floating gate is difficult to precisely control during erasing. If too many electrons are ejected from the floating gate, the floating gate has net positive charges. This phenomenon is called "over-erasing". When the over-erasing effect is severe, the channel under the floating gate is switched on even when the working voltage is not applied to the control gate. This may lead to an error in data reading. Therefore, a split gate design is adopted in many kinds of flash memory. One of the characteristics of the split gate is that the control gate has a portion above the floating gate and another portion above the substrate with separation of a gate dielectric layer. Thus when the over-erasing occurs to switch on the channel under the floating gate even if there is no working voltage applied, the channel under the control gate remains closed. Therefore, the drain and the source still cannot be electrically connected. This prevents the data from being erratically determined.

The process for fabricating the split gate flash memory in the prior art is described as following with reference to FIGS. 1A to 1D.

Figure 1A:
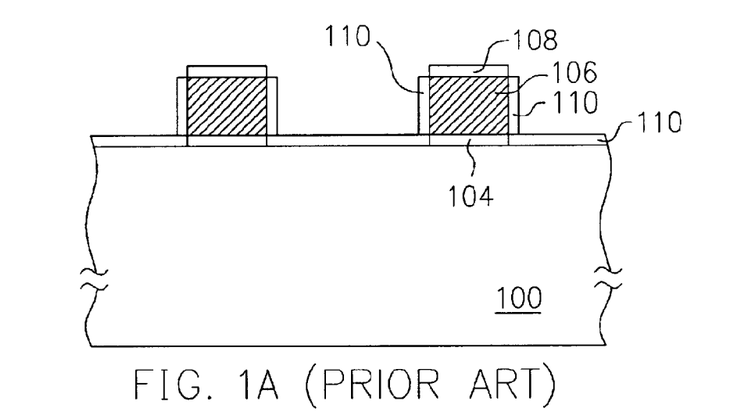
FIGS. 1A to 1D schematically illustrate the process flow of a split gate flash memory in the prior art in a cross-sectional view.

As shown in FIG. 1A, a substrate 100 is provided. A gated oxide 104, a polysilicon layer 106 and a dielectric layer 108 is sequentially formed on the substrate 100, wherein the polysilicon layer 106 serves as a floating gate. A thermal oxidation process is carried out to form an oxide layer 110 on the sidewalls of the polysilicon layer 106 and on the substrate 100.

Figure 1B:
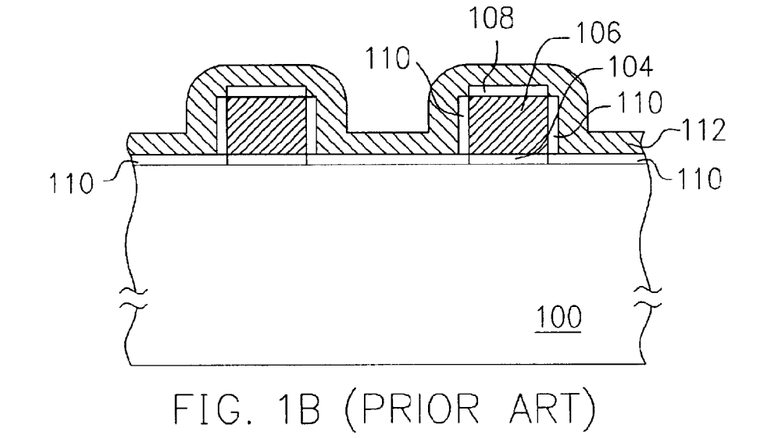

As shown in FIG. 1B, a conformal polysilicon layer 112 is formed on the substrate 200 covering the dielectric layer 108 and oxide layer 110.

Figure 1C:
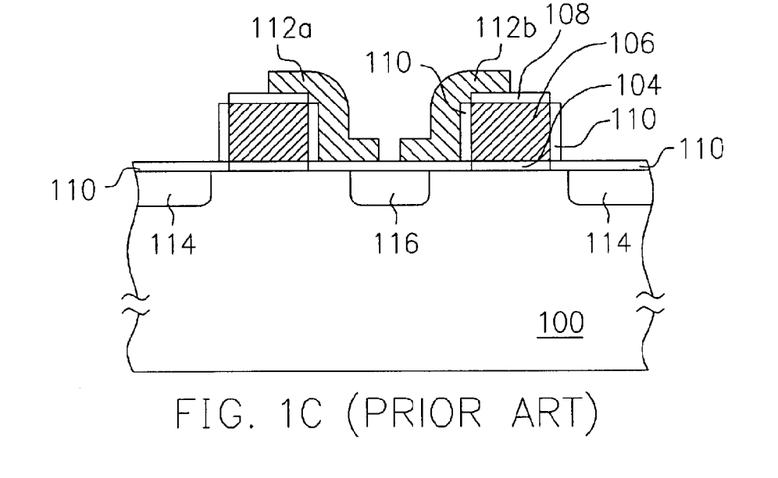

As shown in FIG. 1C, a photolithography process and an etching process are performed to form control gates 112a and 112b covering a portion of floating gate 106 and a portion of the substrate 100. An ion implantation process is carried out to form a common source 116 in the substrate 100 between the control gates 112a and 112b and a drain 114 in the substrate 100 on the other side of the floating gate 106.

Figure 1D:
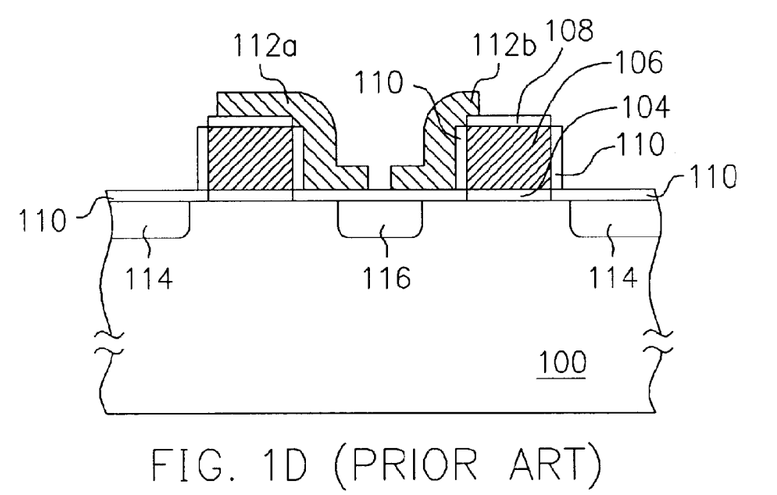

There are some problems in the conventional method for fabricating the spilt gate flash memory. One is that the control gates 112a and 112b have non-uniform width as shown in FIG. 1D. Since the patterning process is not carried out by using a self-aligned method, the misalignment of the photolithography process will lead to asymmetric control gates 112a and 112b. Therefore, the size of the control gate, the channel length and the channel current of each memory are also not constant. This affects the quality of the product. The other problem is that the process window in the conventional method is small since a self-aligned method is not used. This causes a disadvantage that the cell dimension is hard to scale down. Another problem is that two adjacent memory cells are unsymmetrical and have different electric properties since the memory cells are not formed on strip-like active regions.

SUMMARY OF INVENTION

The present invention provides a flash memory with a self-aligned spilt gate and the methods for fabricating and for operating the same to solve the problem that the adjacent memory cells are unsymmetrical and not potential equivalent as in the prior art.

The present invention also provides a method for operating a flash memory with a self-aligned spilt gate in order to reduce the operating voltage in the programming, erasing or reading operation.

The present invention provides a flash memory with a self-aligned spilt gate. The flash cell consists of a substrate, a deep n-type well and a shallow p-type well, a gate oxide layer, a control gate, a capping layer, a floating gate, a tunnel oxide layer, a drain, a common source and a pocket p-well. The deep n-type well is located in the substrate and the shallow p-type well is located in the deep n-well. The control gate is located on the substrate covering a portion of the shallow p-type well. The gate oxide is located between the control gate and the substrate and the capping layer is located on the control gate. The floating gate is located on one sidewall of the control gate and the capping layer and over the substrate. The tunnel oxide layer is located between the control gate and the floating gate and between the floating gate and the substrate. In the present invention, a dielectric spacer is further on the other sidewall of the control gate and the capping layer to protect the control gate from being damaged during a subsequent metal interconnection process. The drain is located in the deep n-type well under the dielectric spacer and adjacent to the control gate. A common source is located in and connected to the deep n-type well and under extending to a portion of the floating gate and adjacent to the shallow p-type well. A pocket p-well is located in the substrate around the drain and electrically connecting the divided shallow p-type wells beside the drain to make the shallow p-type well of each cell potential equivalent.

The present invention provides a method for fabricating a flash memory with a self-aligned spilt gate. An isolation is formed on a substrate to define an active region. A deep n-type well is formed in a substrate and a shallow p-type well is formed in the deep n-well. A gate oxide layer, a control gate and a capping layer are formed on a portion of the shallow p-type well. A tunnel oxide layer is formed on the sidewalls of the control gate and on the substrate by conducting a thermal process. A conformal conductive layer is formed covering the capping layer and the substrate. The conformal conductive layer is etched back to form a conductive spacer on the sidewalls of the capping layer and the control gate. Thereafter, the conductive spacer on one side of the control gate is removed to leave the conductive spacer on the other side as a floating gate. A common source is formed in and connects to the deep n-well, wherein the common source under extends to a portion of the floating gate about a half of the floating gate width. A drain is formed in the shallow p-type well adjacent to the control gate. A dielectric spacer is formed on the sidewall of the control gate without the conductive spacer formed thereon to protect the control gate from being damaged in subsequent etching processes. A pocket p-well is formed around the drain to connect with the shallow p-type well beside the drain.

The present invention provides a method for operating a spilt gate flash memory. The split gate flash memory cell comprises a substrate, a deep n-type well in the substrate, a shallow p-type well in the deep n-well, a gate oxide layer on the shallow p-type well, a control gate on the gate oxide layer, a capping layer on the control gate, a floating gate on one sidewall of the control gate and the capping layer and over a portion of the substrate, a tunnel oxide layer between the control gate and the floating gate and between the floating gate and the substrate, a dielectric spacer on the other sidewall of the capping layer and the control gate, a drain in the shallow p-type well and adjacent to the control gate, a common source located in and connected to the deep n-type well and under, extending to a portion of the floating gate about a half of the floating gate width, and a pocket p-well located in the substrate around the drain and electrically connecting with the shallow p-type well. During the programming, a first voltage, such as 2 volts, is applied to the control gate to turn it on. A second voltage, such as 10 volts, is applied to the common source, and the drain and the pocket p-well are ground. Since the common source and the whole deep n-type well have the second voltage (e.g., 10 volts), the floating gate is coupled with a voltage about one half of the second voltage (e.g., about 5 to 6 volts). Since the channel length is very short, a large electric field is established in the vertical direction and in the lateral direction of the substrate. Consequently, hot electrons are formed and injected into the floating gate through the tunnel oxide. Therefore, the split gate cell uses source side injection for programming. During the erase operation, a third voltage, such as 20 volts, is applied to the control gate to eject electrons from the floating gate to the control gate by Fowler-Nordheim tunneling. In another erase method, a positive voltage, such as 12 volts, is applied to the control gate, a negative voltage, such as −8 volts, is applied to the common source, and the drain and the pocket p-well are floated to eject electrons by Fowler-Nordheim tunneling. During the reading operation, $V_{cc}$ is applied to the control gate, a fourth voltage, such as 1.5 volts, is applied to the drain, and the common source and the pocket p-well are ground.

The design of the present invention is that the common source is picked up by the deep n-well, so the cell current unsymmetry problem caused by block-like active regions can be avoided. Furthermore, since the floating gate is self-aligned to the control gate, the misalignment of the two can be avoided.

Moreover, the flash memory cell of the present invention uses a stacked gate structure including only a floating and a control gate, so its fabrication is simpler than that of the flash memory in the prior art that uses a stacked gate structure consisting of three polysilicon layers.

Moreover, this flash memory is erased by ejecting the electrons from the floating gate to the control gate by Fowler-Nordheim tunneling, so the over-erase problem can be overcome. Therefore, the biases applied in programming, erase and reading operations of the split gate flash memory of the present invention is lower than those applied in the prior art.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 2:
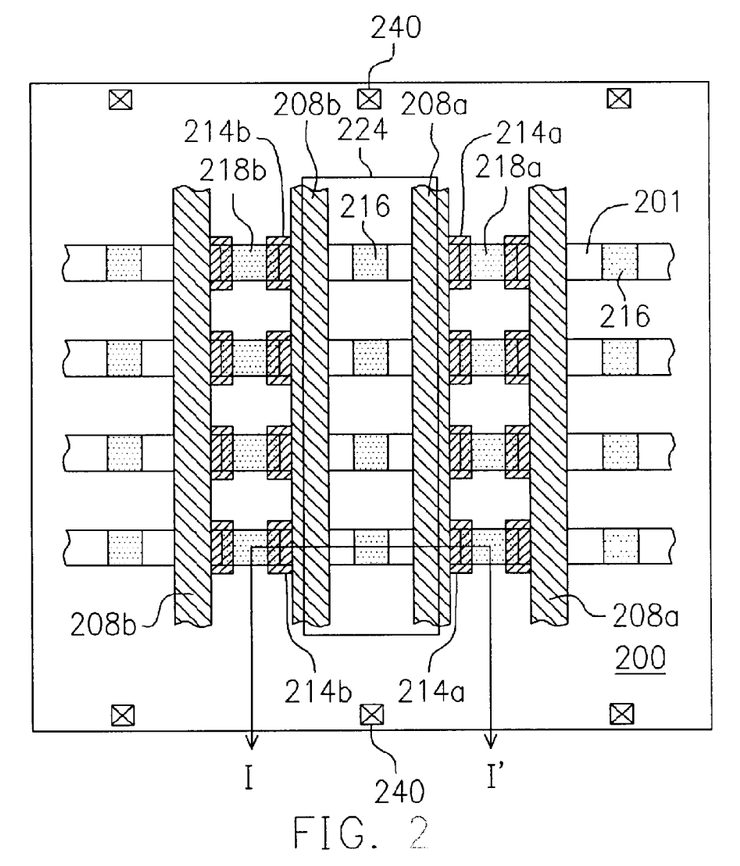
FIG. 2 schematically illustrates the top view of the self-aligned split gate flash memory according to a preferred embodiment of the present invention.
Figure 5:
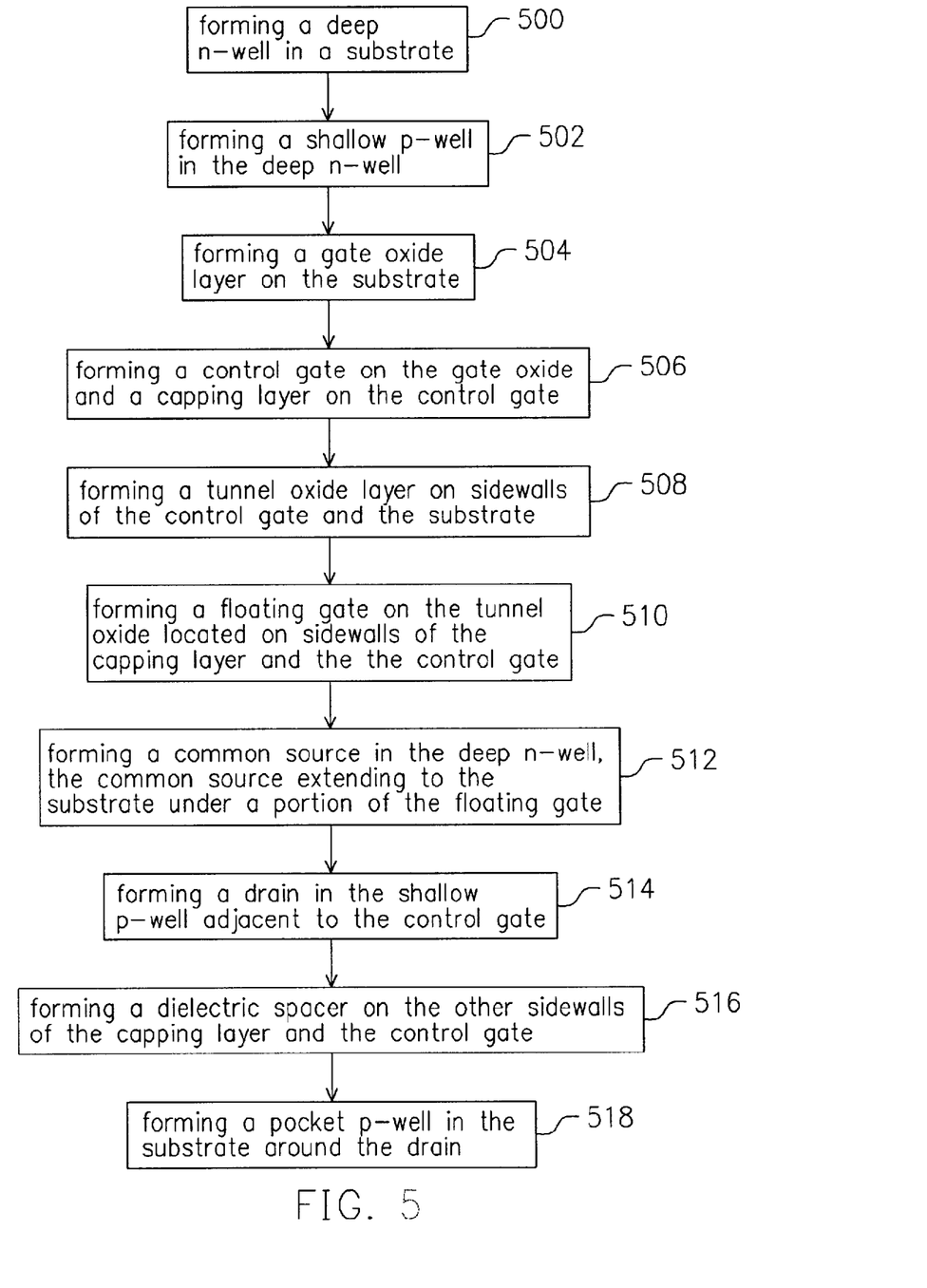
FIG. 5 shows a flow chart of fabricating the self-aligned split gate flash memory according to the preferred embodiment of the present invention.

FIG. 2 schematically illustrates the top view of the self-aligned split gate flash memory according to the preferred embodiment of the present invention, wherein two pairs of memory cells are shown in each row of the memory array. FIGS. 3A to 3H schematically illustrate the process flow of fabricating the spilt gate flash memory in FIG. 2 in a cross-sectional view along line I–I". FIG. 5 shows a flow chart of fabricating the self-aligned split gate flash memory according to the preferred embodiment of the present invention.

Figure 3A:
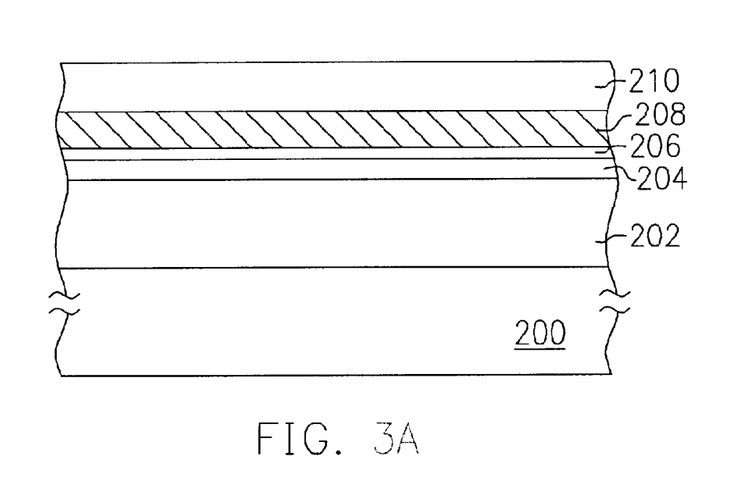
FIGS. 3A to 3H schematically illustrate the process flow of fabricating the spilt gate flash memory in FIG. 2 in a cross-sectional view along line I–I".

Referring to FIG. 2, FIG. 3A and FIG. 5, a substrate 200, such as a p-type silicon substrate, is provided. Isolation (non shown) is formed on the substrate to define an active region 201. A deep well 202, such as an n-type deep well, is formed in the substrate 200 (step 500). A shallow well 204, such as a p-type shallow well, is then formed in the deep well 202 by, for example, an ion implantation process (step 502). The implanted ion used in the ion implantation process for forming the p-type shallow well includes boron ion. The implanting energy in the ion implantation process is about 20 KeV and the dosage is about $1 \times 10^{12}/cm^2$.

Thereafter, a gate oxide layer 206 is formed on the substrate 200 (step 504). The gate oxide layer 206 is formed with a thermal process, for example, and is about 250 Angstroms thick. A conductive layer 208 is formed on the gate oxide layer 206. The conducting layer 208 is, for example, a polysilicon layer with a thickness of 600 Angstroms and the polysilicon is doped for reducing the resistance. The method of doping the polysilicon layer comprises an ion implantation process. The implanted ion includes arsenic ion. The implanting energy in the ion implantation process is about 30 KeV and the dosage is about $1 \times 10^{15}/cm^2$. A capping layer 210, such as an oxide layer with a thickness of about 3500 Angstroms, is formed on the conducting layer 208.

Figure 3B:
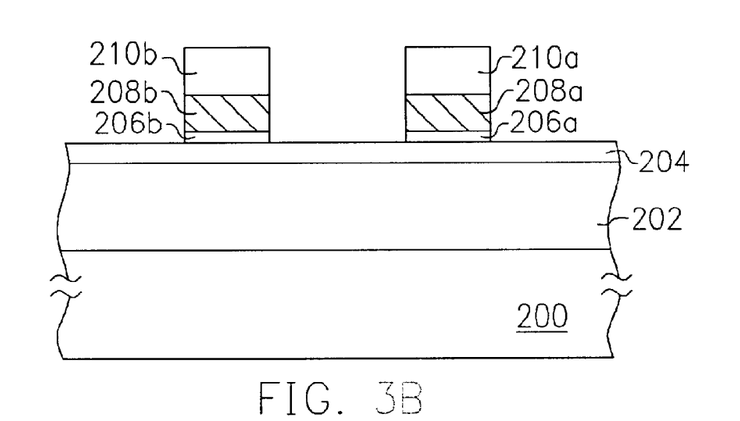

Refering to FIGS. 2, 3B and FIG. 5, a photolithography process and an etching process are conduced for patterning the capping layer 210 and the conductive layer 208 to form patterned capping layers 210a and 210b and two control gates 208a and 208b (step 506). In the patterning method, for example, a patterned resist is formed on the capping layer 210 and then the capping layer 210 is etched to form the patterned capping layers 210a and 210b with the patterned resist as a mask. The patterned resist is removed and the conductive layer 208 is etched to form the control gates 208a and 208b with the patterned capping layer 210a and 210b as a mask layer. Thereafter, the gate oxide layer 206 exposed by the control gate 208a and 208b is removed with a cleaning process to expose the substrate 200, while the gate oxide layer 206a and 206b under the control gate 208a and 208b are left.

Figure 3C:
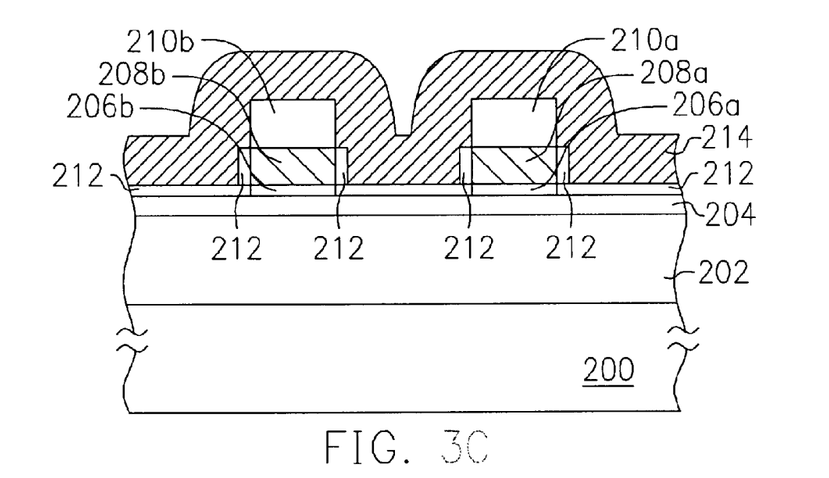

As shown in FIG. 3C and FIG. 5, a thermal process is performed to form a tunnel oxide layer 212 on the sidewalls of the control gate 208a and 208b and on the substrate 200 (step 508). Since the control gates 208a and 208b are doped with arsenic ions, the tunnel oxide layer 212 formed on the sidewalls of the control gates 208a and 208b is thicker than the tunnel oxide layer 212 formed on the substrate 200. For example, the thickness of the former is about 300 Angstroms and that of the latter is about 90 Angstroms.

Thereafter, a conformal conductive layer 214 is formed on the substrate 200 covering the patterned capping layer 210a and the tunnel oxide layer 212. The conformal conducting layer 214 is, for example, a polysilicon layer doped with phosphorous ions and with a thickness of about 3000 Angstroms. A method for doping the polysilicon layer comprises, for example, conducting an implantation process to introduce phosphorous ions into the polysilicon layer, wherein the implanting energy is about 60 KeV and the dosage is about $5 \times 10^{14}/cm^2$.

Figure 3D:
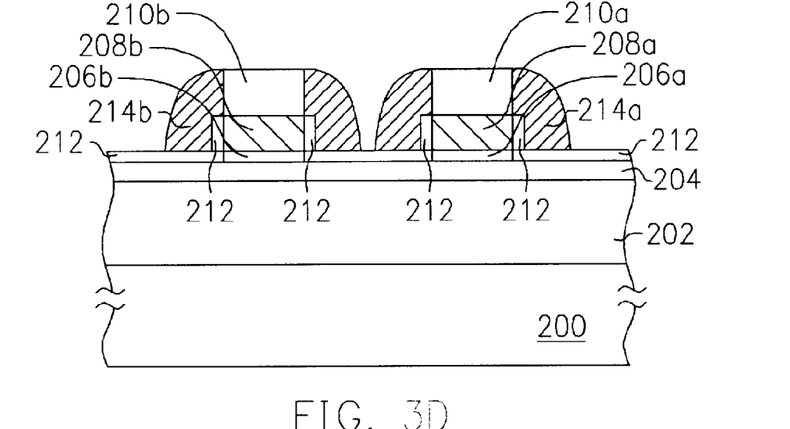

As shown in FIG. 3D, the conformal conducting layer 214 is etched back to form a conductive spacer 214a on the sidewalls of the control gate 208a and 208b and the patterned capping layer 210a. The tunnel oxide layer 212 isolates the conductive spacer 214a from the control gate 208a and also isolates the conductive spacer 214a from the substrate 200.

Figure 3E:
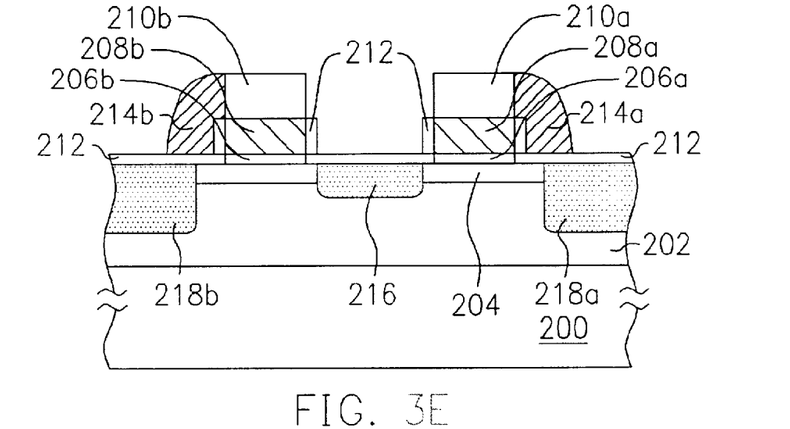

As shown in FIGS. 2, 3E and 5, a photolithography process and an etching process are conducted to remove a portion of the conductive spacer 214a so that a pair of conductive spacers 214a and 214b are left on two sides of the control gate pair 208a and 208b on the active region 201 (step 510). The conductive spacers 214a and 214b left on the sidewall of the control gate 208a and 208b serve as a floating gate.

The floating gate of the split gate flash memory of the present invention is formed by etching back the conformal conducting layer 214, so the floating gate is self-aligned to the control gate 208a. Therefore, misalignment and the problems arising therefrom can be avoided.

Figure 6:
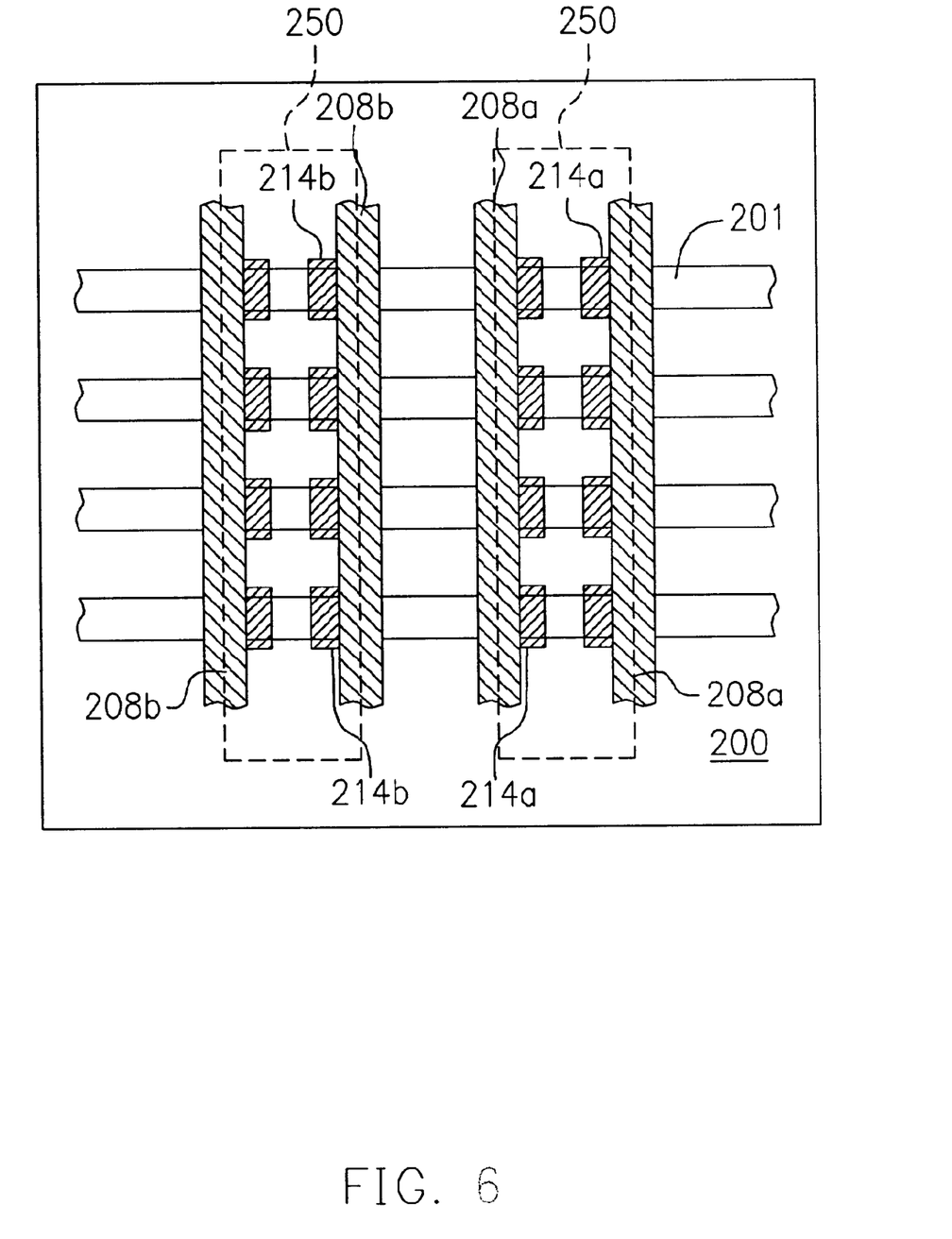
FIG. 6 schematically illustrates the top view of the self-aligned split gate flash memory after the common source is formed according to the preferred embodiment of the present invention.

Thereafter, two common sources 218a and 218b are formed in the deep well 202 through the shallow well 204 adjacent to the floating gates 214a and 214b, respectively (step 512). The common sources 218a and 218b are formed by performing an ion implantation process with a mask layer 250 shown in FIG. 6, wherein a region surrounded by the mask layer 250 is implanted with ions. The implanted ion is, for example, an n-type ion. The implanting energy is about 60 KeV and the dosage is about $1 \times 10^{14}/cm^2$. A thermal process is conducted at, for example, 600° C.~900° C. in order to drive the dopants into the substrate 200. Therefore, the common source 218a and 218b extends to the substrate under a portion of the floating gate 214a and 214b and connects with the deep well 202. The portion of the common source 218a and 218b under the floating gate 214a and 218b has a width about a half of the width of the floating gate 214a and 214b. Another photolithography process and another ion implantation process are performed to form a drain 216 such as n-type drain in the shallow well 204 between the control gate 208a and 208b (step 514). The dosage for forming the drain 216 is higher than that for forming the common source 218.

Figure 3F:
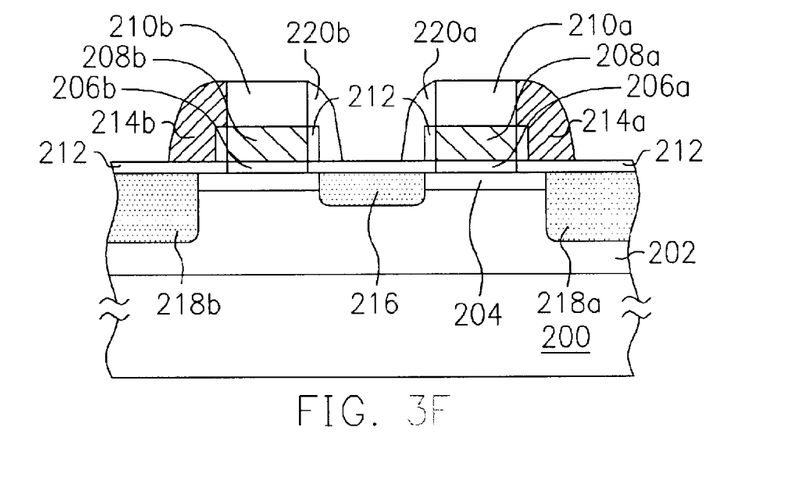

As shown in FIGS. 3F and 5, a pair of dielectric spacers 220a and 220b are formed on the sidewalls of the control gate 208a and 208b where the floating gate 214a and 214b are not formed (step 516). Thus, the control gate 208a and 208b can be protected from damages during the subsequent etching process of interconnect. The material of the dielectric spacer 220a and 220b is, for example, silicon nitride or silicon oxide.

Figure 3G:
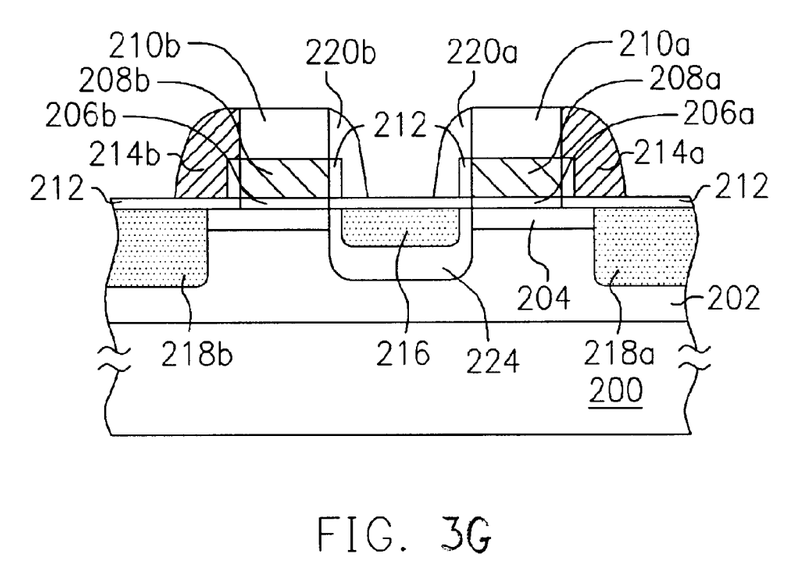

As shown in FIGS. 2, 3G and 5, a pocket ion implantation process is conducted to form a pocket well 224, such as an pocket p-well, around the drain 216 and into the deep well 202 through the shallow well 204 (step 518). The dosage of the pocket ion implantation process is about $1 \times 10^{13}/cm^2$, and the implanting energy is enough for penetrating the isolation. Since the thickness of the control gate 208a and the capping layer 210a is about 4000 Angstroms, the implanted ions can not penetrate the control gate 208a. The purpose of forming the pocket well 224 is to connect the shallow wells 204 in the same column of memory cell pairs to make all of the shallow wells 204 connected each other.

Figure 3H:
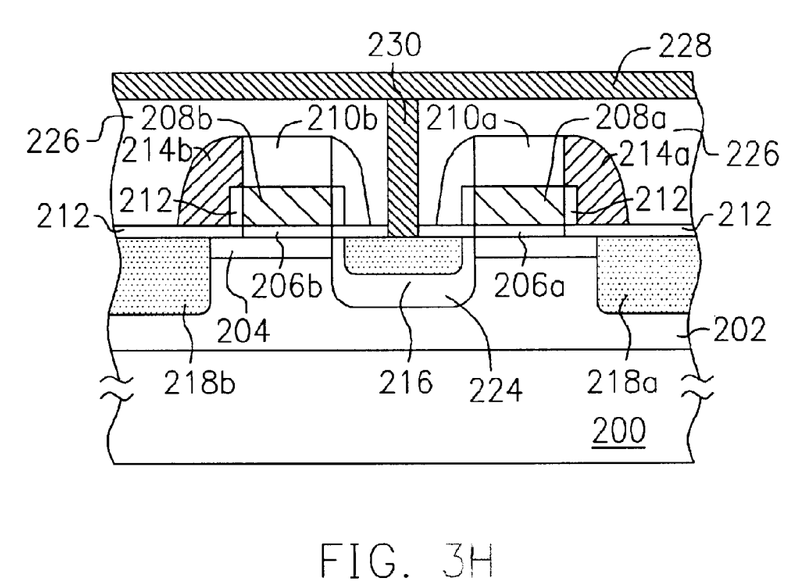

Refer to FIG. 3H, an interlayer dielectric layer (ILD) 226 is formed on the substrate 200, and then a contact 230 and wiring line 228 are formed in and on the interlayer dielectric layer 226, respectively. Moreover, in the preferred embodiment of this invention, other contacts 240 can be formed to pick up the pocket p-wells 224 to connect the pocket p-wells 224 with other conductive structures, as shown in FIG. 2.

As shown in FIG. 3H, the self-aligned split gate flash cell of the preferred embodiment consists of a substrate 200 having a deep n-type well 202 and a shallow p-type well 204, a gate oxide layer 206a, a control gate 208a, a capping layer 210a, a floating gate 214a, a tunnel oxide layer 212, a dielectric spacer 220, a drain 216, a common source 218a and a p-type pocket well 224.

The shallow p-type well 204 is located in the deep n-type well 202. The control gate 208a is located on the gate oxide layer 206a formed on the p-shallow well 204. The capping layer is located on the control gate 208a. The floating gate 214a is located on one sidewall of the control gate 208a and the capping layer 210a and over the substrate 200. The tunnel oxide layer 212 is located between the control gate 208a and the floating gate 214a and between the floating gate 214a and the substrate 200. The dielectric spacer 220 is located on the other sidewall of the control gate 208a and the capping layer 210a. The drain 216 is located in the substrate 200 under the dielectric spacer 220 adjacent to the control gate 208a. The common source 218a is located in the substrate 200 adjacent to the shallow p-type well 204 and into the deep well 202, and extends to the substrate 200 under a portion of the floating gate 214a. The p-type pocket p-well 224 is located in the substrate 200 around the drain 216 and serves to electrically connect the divided shallow p-type well s 204 beside the drain 216.

The difference between the split gate flash cells of the present invention and the prior art lies in the fact that the relative position of the control gate and floating gate is reversed. Because of the aforementioned structure, the performance of the split gate flash memory of the present invention is better than that in the prior art. The reasons are described as follows.

Figure 4:
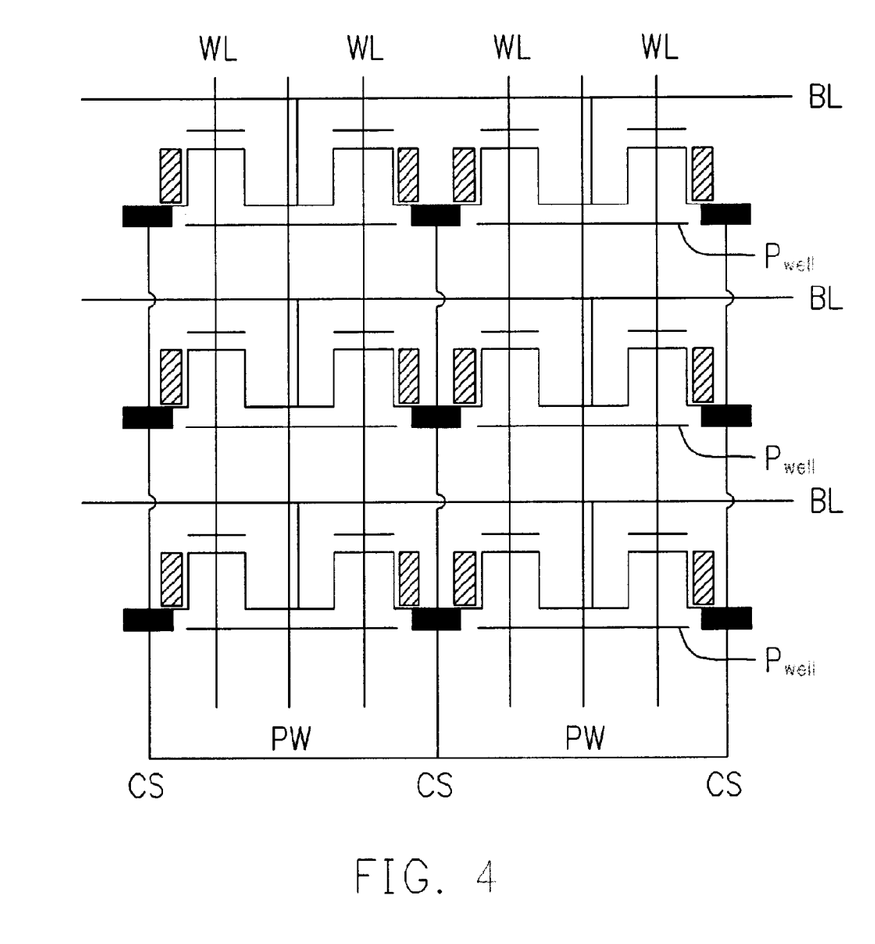
FIG. 4 illustrates a circuit diagram of the self-aligned split gate flash memory according to the preferred embodiment of the present invention.

Refer to FIG. 4, FIG. 4 illustrates a circuit diagram of the self-aligned split gate flash memory according the preferred embodiment of the present invention.

As shown in FIG. 4, the split gate of the present invention comprises a cell array, the word lines WL and the bit lines BL perpendicular to the word lines WL, wherein each cell is selected by one word line WL and one bit line BL.

In each cell, the drain is electrically coupled to a bit line BL and the control gate is electrically coupled to a word line WL. The sources are electrically coupled to each other by the deep n-well, so a common source CS is formed with equal potential. Therefore, in a memory block, all memory cells share a common source. The pocket p-well is used to connect the shallow p-type well s in the same column of memory cell pairs. Refer to FIG. 4, since the shallow p-type well s of the cells in the same column are picked up by the pocket p-wells, the shallow p-type well of each cell is potential equivalent.

A method of operating a split gate flash cell of the present invention is described as follow: This split gate cell uses source side injection in programming. During the programming, a first voltage, such as 2 volts, is applied to the control gate to turn it on. A second voltage, such as 10 volts, is applied to a common source, and the drain and the pocket p-well are grounded. Because the common source and the whole deep n-type well are in the second voltage (e.g., 10 volts), the voltage coupled to the floating gate is about one half of the second voltage (e.g., about 5 to 6 volts). Since the channel length under the floating gate is very short and the thickness of the tunnel oxide on the sidewall of the control gate is about 300 Angstroms, a large electric field is established in the vertical direction and the lateral direction of the substrate. Consequently, hot electrons are formed there and are injected into the floating gate through the tunnel oxide.

During an erase operation, a third voltage, such as 20 volts, is applied to the control gate and the common source, the drain and the pocket p-well are all floated to eject electrons from the floating gate to the control gate by Fowler-Nordheim tunneling. In another erase method, a positive voltage, such as 12 volts, is applied to the control gate, a negative voltage, such as −8 volts, is applied to the common source, and the drain and pocket p-well are floated to erase the data by Fowler-Nordheim tunneling.

During a reading operation, $V_{cc}$ is applied to the control gate, a forth voltage, such as 1.5 volts, is applied to the drain, and the common source and the pocket p-well are ground.

Moreover, the design of the present invention is that the common source is picked up by the deep n-well, so the cell current unsymmetry problem caused by block-like active regions does not occur. Furthermore, since the floating gate is self-aligned to the control gate, the misalignment of the two can be avoided.

Moreover, the flash memory cell of the present invention uses a stacked gate structure including only a floating and a control gate, so its fabrication is simpler than that of the flash memory in the prior art that uses a stacked gate structure consisting of three polysilicon layers. Furthermore, since this flash memory cell is programmed by source side injection, a low voltage is sufficient for the programming.

Moreover, this flash memory is erased by ejecting the electrons from the floating gate to the control gate by Fowler-Nordheim tunneling, so the over-erase problem can be overcome. Therefore, the biases applied in programming, erase and reading operations of the split gate flash memory of the present invention is lower than those applied in the prior art.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of fabricating a self-aligned split gate flash cell, comprising:

forming a deep well of a first conductivity type in a substrate;

forming a shallow well of a second conductivity type in the deep well;

forming a gate oxide layer on the substrate;

forming a control gate on the gate oxide layer, wherein a capping layer is disposed on the control gate, and the capping layer and the control gate form a stacked structure;

forming a tunnel oxide layer on sidewalls of the control gate and the substrate;

forming a conformal conducting layer covering the capping layer and the substrate;

etching back the conformal conducting layer to form a conductivity spacer on the tunnel oxide located on sidewalls of the capping layer and the control gate;

removing the conductivity spacer on one side of the control gate to leave the conductivity spacer on the other side serving as a floating gate;

forming a drain and a common source beneath each side of the stacked structure in the substrate, wherein the depth of the drain and the common source are larger than the depth of the shallow well of the second conductivity type; and forming a pocket well of the second conductivity type in the substrate around the drain.

2. The method of claim 1, wherein the deep well is an n-type deep well, the shallow well is a shallow p-type well and the pocket well is a p-type well.

3. The method of claim 1, wherein the drain and the common source are n⁺ doped regions, and the deep well of the first conductivity type is an n⁻ doped region.

4. The method of claim 1, wherein the tunnel oxide layer between the control gate and the floating gate is thicker than the tunnel oxide layer between the floating gate and the substrate.

5. The method of claim 1, wherein forming the control gate and the capping layer comprises:

forming a conducting layer and a capping material layer on the gate oxide;

patterning the capping material layer to form the capping layer; and patterning the conducting layer to form the control gate by using the capping layer as an etching mask.

6. The method of claim 1, wherein forming the pocket well of the second conductivity type comprises performing a pocket implantation.

7. The method of claim 1, further comprising forming a dielectric spacer on another sidewall of the control gate.

8. The method of claim 1, wherein the tunnel oxide is formed by conducting a thermal oxidation process.

9. The method of claim 1, wherein the floating gate comprises a doped polysilicon layer.

10. The method of claim 1, wherein the capping layer comprises an oxide layer.

11. The method of claim 1, wherein the control gate comprises a doped polysilicon layer.

12. A method for operating a split gate flash memory cell, wherein the split gate flash memory cell comprises a substrate, a deep n-type well in the substrate, a shallow p-type well in the deep n-well, a gate oxide layer on the shallow p-type well, a control gate on the gate oxide layer, a capping layer on the control gate, a floating gate on a first sidewall of the control gate and the capping layer and over a portion of the substrate, a tunnel oxide layer between the control gate and the floating gate and between the floating gate and the substrate, a dielectric spacer on the other sidewall of the capping layer and the control gate, a drain in the shallow p-type well and adjacent to the control gate, a common source located in the deep n-type well and extending to the substrate under a portion of the floating gate, and a pocket p-well located in the substrate around the drain and electrically connecting with the shallow p-type well, the method comprising:

during a programming operation, applying a first voltage to the control gate, applying a second voltage to the common source and grounding the drain and the pocket p-well to cause source side injection;

during an erase operation, applying a third voltage to the control gate to eject electrons from the floating gate to the control gate by Fowler-Nordheim tunneling; and during an reading operation, applying $V_{cc}$ to the control gate, applying a forth voltage to the drain and grounding the common source and the pocket p-well.

13. The method of claim 12, wherein the erase operation comprises:

applying a positive voltage to the control gate, applying a negative voltage to the common source and floating the drain and the pocket p-well to cause Fowler-Nordheim tunneling for erasing.

14. The method of claim 13, wherein the positive voltage is about 12V and the negative voltage is about 8V.

15. The method of claim 12, wherein the first voltage is about 2V and the second voltage is about 10V.

16. The method of claim 12, wherein the third voltage is about 20V.

17. The method of claim 12, wherein the forth voltage is about 1.5V.

* * * * *